United States Patent
Chan et al.

(10) Patent No.: US 6,281,117 B1
(45) Date of Patent: Aug. 28, 2001

(54) METHOD TO FORM UNIFORM SILICIDE FEATURES

(75) Inventors: Lap Chan, San Francisco, CA (US); Chaw Sing Ho, Singapore (SG); Fong Yau Sam Li, Singapore (SG); Hou Tee Ng, Singapore (SG)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/425,994

(22) Filed: Oct. 25, 1999

(51) Int. Cl.$^7$ .............................................. H01L 21/4763
(52) U.S. Cl. ........................ 438/649; 438/651; 438/682
(58) Field of Search ........................... 438/630, 648–651, 438/655, 682–683

(56) References Cited

U.S. PATENT DOCUMENTS

| | | | |
|---|---|---|---|
| 4,908,334 | 3/1990 | Zuhr et al. | 437/200 |
| 4,957,777 | 9/1990 | Ilderem et al. | 427/55 |
| 5,075,243 | * 12/1991 | Nieh et al. . | |
| 5,510,295 | 4/1996 | Cabral, Jr. et al. | 437/200 |
| 5,702,972 | 12/1997 | Tsai et al. | 437/56 |
| 5,712,191 | 1/1998 | Nakajima et al. | 437/174 |
| 5,728,625 | 3/1998 | Tung | 438/586 |
| 5,918,143 | * 6/1999 | Beauvais et al. | 438/607 |

* cited by examiner

*Primary Examiner*—Jey Tsai
(74) *Attorney, Agent, or Firm*—George O. Saile; Rosemary L. S. Pike

(57) ABSTRACT

A method for forming uniform ultrathin silicide features in the fabrication of an integrated circuit is described. A metal layer is deposited over the surface of a silicon semiconductor substrate. An array of heated metallic tips contact the metal layer whereby the metal layer is transformed to a metal silicide where it is contacted by the metallic tips and wherein the metal layer not contacted by the metallic tips is unreacted. The unreacted metal layer is removed leaving the metal silicide as uniform ultrathin silicide features. Alternatively, a metal acetate layer is spin-coated over the surface of a silicon semiconductor substrate. An array of heated metallic tips contacts the metal acetate layer whereby the metal acetate layer is transformed to a metal silicide where the metallic tips contact the metal acetate layer and wherein the metal acetate slayer not contacted by the metallic tips is unreacted. Or the metal acetate layer is heat treated at localized regions using a multi-array of tips aligned in a specific layout. Or the metal acetate layer is contacted by heated metallic tips under vacuum so that the metal does not oxidize. The unreacted metal acetate layer is removed leaving the metal silicide as the uniform ultrathin silicide features.

23 Claims, 3 Drawing Sheets

METHOD TO FORM UNIFORM SILICIDE FEATURES

BACKGROUND OF THE INVENTION

(1) Field of the Invention

The invention relates to the fabrication of integrated circuit devices, and more particularly, to a method of forming uniform ultrathin silicide features in the fabrication of integrated circuits.

(2) Description of the Prior Art

In the fabrication of integrated circuits, the fabrication of ultrathin uniform silicide layers on sub 0.1 micron features is expected to be extremely difficult using the standard salicide (self-aligned silicide) process. A key problem is the interfacial non-uniformity as the silicide thickness is scaled down from about 1000 Angstroms to about 300 Angstroms. This non-uniformity issue of. ultrathin silicide films is mainly related to the statistical nature of the nucleation events required to form the resulting low-resistivity phase, as well as the non-uniformity of the existing rapid thermal annealing (RTA) process.

U. S. Pat. No. 5,712,191 to Nakajima et al teaches spin coating a nickel acetate solution onto a silicon layer and heat treating at 300–500° C. to form nickel suicide. A laser light is then irradiated to promote crystal growth in the area of the nickel silicide. However, laser irradiation or modification may not allow features smaller than submicron scale to be fabricated. Laser irradiation only allows a single localized modification at any one time. Additionally, laser irradiation has been observed experimentally to induce cracks and film peelings due to the large thermal shock induced in the localized nickel oxide regions at any one time within an extremely short time period. U.S. Pat. No. 5,510,295 to Cabral, Jr. et al teaches depositing a cobalt layer over silicon, annealing the cobalt layer at 900–1000° C. in a $N_2$ ambient, then depositing a titanium layer thereover and annealing to form titanium silicide. U.S. Pat. No. 4,908,334 to Zuhr et al forms a silicide film by ion beam deposition of metal onto silicon at 400–600° C. U.S. Pat. No. 5,728,625 to Tung discloses growing cobalt silicide on silicon in ultra-high vacuum and growing cobalt on silicon and then annealing at 450–800° C. to form cobalt silicide. U.S. Pat. No. 5,702,972 to Tsai et al teaches depositing titanium onto silicide to form titanium silicide and then annealing to change the titanium silicide from phase C49 to phase C54. U.S. Pat. No. 4,957,777 to Ilderem et al teaches depositing titanium silicide over polysilicon using silane.

SUMMARY OF THE INVENTION

A principal object of the present invention is to provide an effective and very manufacturable method of fabricating a uniform silicide film in the fabrication of an integrated circuit.

A further object of the invention is to provide a method of fabricating uniform ultrathin silicide features in the fabrication of an integrated circuit.

Yet another object is to provide a method of forming uniform silicide features having a spatial width of 0.1 microns and below.

Yet another object is to provide a method of localized and uniform formation of silicide.

Yet another object of the invention is to provide a method for uniform formation of silicide utilizing a cost-effective precursor for silicide formation.

A still further object of the invention is to provide a method for uniform formation of silicide wherein oxidation of a metallic oxide is avoided.

In accordance with the objects of the invention a method for forming uniform ultrathin silicide features in the fabrication of an integrated circuit is achieved. A metal layer is deposited over the surface of a silicon semiconductor substrate. An array of heated metallic tips contact the metal layer whereby the metal layer is transformed to a metal silicide where it is contacted by the metallic tips and wherein the metal layer not contacted by the metallic tips is unreacted. The unreacted metal layer is removed leaving the metal silicide as uniform ultrathin silicide features.

Also, in accordance with the objects of the invention, a metal acetate layer is spin-coated over the surface of a silicon semiconductor substrate. An array of heated metallic tips contacts the metal acetate layer whereby the metal acetate layer is transformed to a metal silicide where the metallic tips contact the metal acetate layer and wherein the metal acetate layer not contacted by the metallic tips is unreacted. The unreacted metal acetate layer is removed leaving the metal silicide as the uniform ultrathin silicide features.

Also, in accordance with the objects of the invention, a metal acetate layer is spin-coated over the surface of a silicon semiconductor substrate. An array of heated metallic tips contacts the metal acetate layer on polysilicon gates and diffusion regions whereby the metal acetate layer is transformed to a metal silicide where the metallic tips contact the metal acetate layer and wherein the metal acetate layer not contacted by the metallic tips is unreacted. The heating is performed in a $H_2$ or $N_2$ ambient under high vacuum to prevent oxidation of the metal surfaces. The unreacted metal acetate layer is removed leaving the metal silicide as the uniform ultrathin silicide features.

BRIEF DESCRIPTION OF THE DRAWINGS

In the accompanying drawings forming a material part of this description, there is shown.

DESCRIPTION OF THE PREFERRED EMBODIMENTS

The present invention embodies three methods for forming uniform ultrathin silicide features in the fabrication of an integrated circuit. The silicide features comprise titanium silicide, cobalt silicide, platinum silicide, tantalum silicide, nickel silicide, or palladium silicide and may have a spatial width of 100 nanometers (0.1 microns) or smaller. Alloy silicides of titanium, cobalt, platinum, tantalum, nickel, or palladium may also be used.

Figure 1:
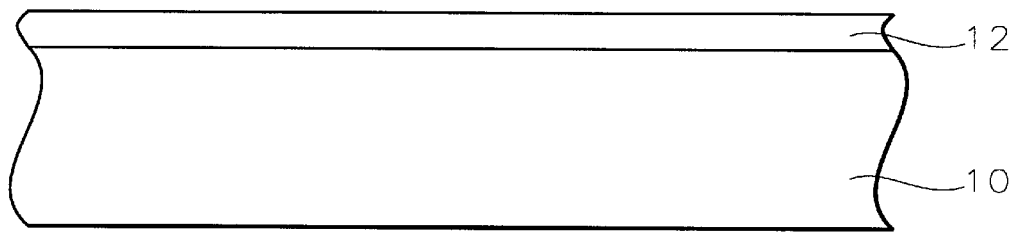
FIGS. 1 through 3 schematically illustrate in cross-sectional representation a first preferred embodiment of the present invention.

The first preferred embodiment of the present invention will be described with reference to FIGS. 1–3. Referring now more particularly to FIG. 1, there is shown an illustration of a portion of a partially completed integrated circuit. The semiconductor substrate 10 is preferably composed of silicon having a (100) crystallographic orientation. The substrate may be an n- or p-type silicon.

An ultrathin film 12 of cobalt or platinum is deposited over the surface of the semiconductor substrate to a thickness of between about 50 and 200 Angstroms. This film is thinner than is conventional. The conventional film thickness is between about 50 and 200 Angstroms. Alternatively, nickel, tantalum, or titanium may be deposited.

Figure 2:
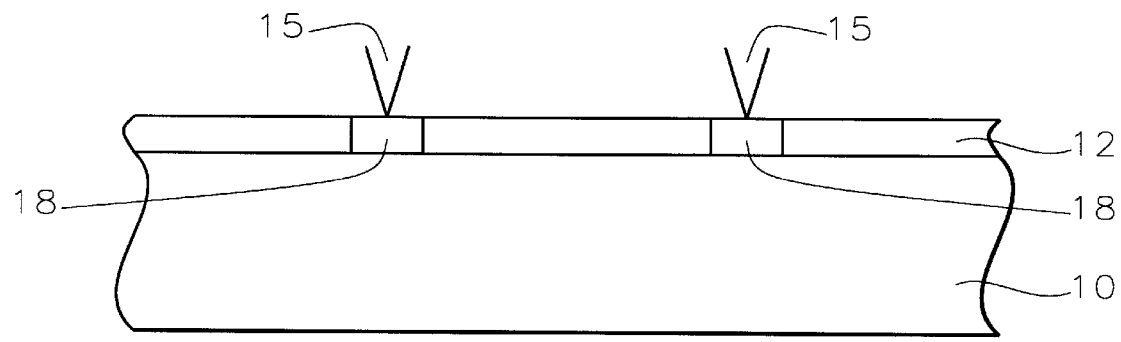

Referring now to FIG. 2, an array of refractory metallic tips 15 made of platinum, tantalum, titanium, or a metal nitride is heated to a temperature of between about 500 and 1200° C. and placed in contact with the thin film 12 at specific locations where the silicide features are to be formed for between about 10 and 20 seconds. The heated metallic tips contacting the thin film causes localized formation of silicide 18. Lines and features may be formed by maneuvering of the metallic tips. The metallic tips are aligned and patterned according to the desired layout.

Each of the metallic tips may be connected to a resistance heating source to ramp them up to the desired temperature. The material used for the tips typically have melting points much higher than the temperature required; that is, nearly twice. The metallic tips typically have a radius of curvature of about 100 nanometers. Such tips are usually used at the atomic level to estimate surface morphology using a technique called atomic force microscopy (AFM) or scanning tunneling microscopy (STM).

Figure 3:
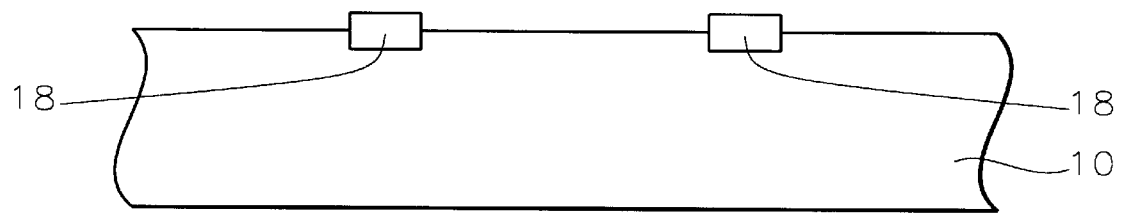

Returning to FIG. 2, the unreacted film 12 is removed, leaving the metallic silicide features 18 on the silicon substrate, shown in FIG. 3.

Figure 4:
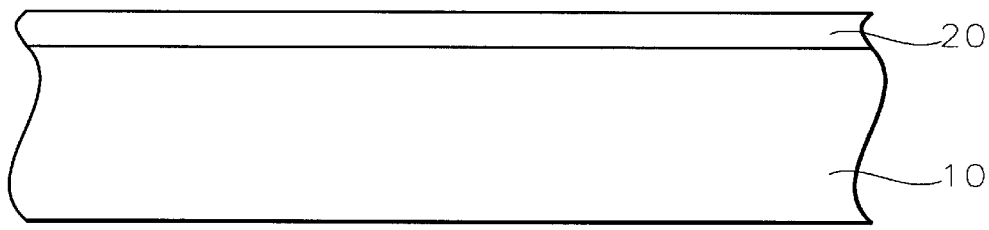
FIGS. 4 and 5 schematically illustrate in cross-sectional representation a second preferred embodiment of the present invention.

A second embodiment of the present invention will now be described with reference to FIGS. 4 and 5. Referring now to FIG. 4, there is shown an illustration of a portion of a partially completed integrated circuit. The semiconductor substrate 10 is preferably composed of silicon having a (100) crystallographic orientation. The substrate may be an n- or p-type silicon.

An ultrathin film of cobalt acetate ($Co(OA_c)_2$) 20 is deposited over the surface of the substrate by a spin-on method to a thickness of between about 500 and 2000 Angstroms.

Figure 5:
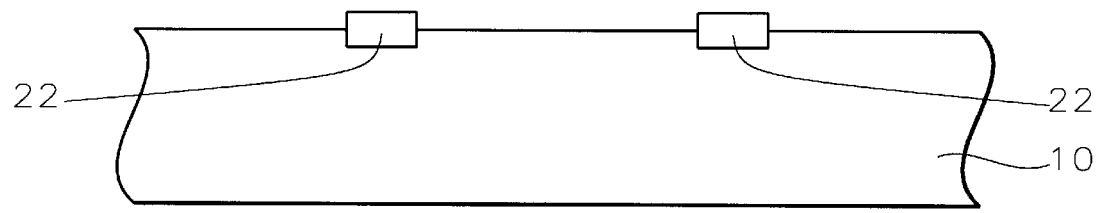

The cobalt acetate is subjected to a thermal treatment using the metallic tips of the first embodiment to transform it to cobalt 14 at locations 22, as shown in FIG. 5.

The thermal treatment also comprises an atmosphere of $H_2$ or $N_2$ in a high vacuum or ultrahigh vacuum and a temperature of about 300 to 500° C. to less than about 900° C. For example, high vacuum is between about $10^{-5}$ and $10^{-7}$ Torr and ultrahigh vacuum is between about $10^{-10}$ and $10^{-11}$ Torr. The thermal treatment forms cobalt silicide lines or features 22 on the silicon substrate without oxidation of the metal surfaces. The unreacted cobalt acetate is removed, for example using an organic solvent; e.g. ethanol, methanol, or isopropyl alcohol (IPA).

Alternatively, in the second embodiment of the invention, nickel acetate, platinum acetate, or palladium acetate may be used in place of the cobalt acetate.

Figure 6:
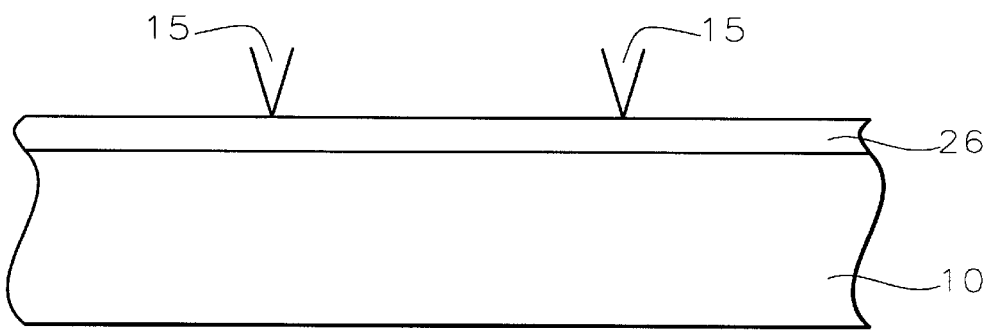
FIGS. 6 through 8 schematically illustrate in cross-sectional representation a third preferred embodiment of the present invention.
Figure 7:
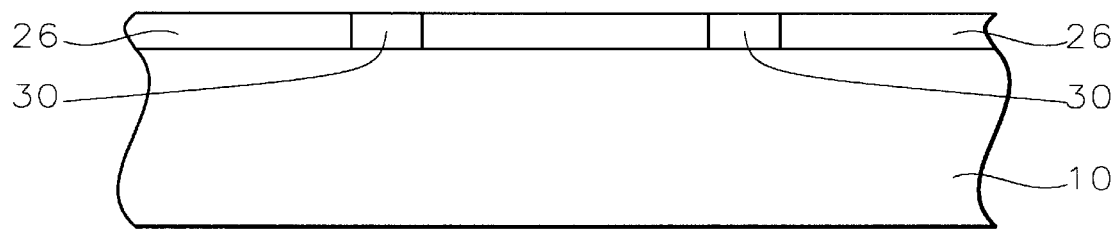

A third embodiment of the present invention will now be described with reference to FIGS. 6 through 8. Referring now to FIG. 6, there is shown an illustration of a portion of a partially completed integrated circuit. The semiconductor substrate 10 is preferably composed of silicon having a (100) crystallographic orientation. The substrate may be an n- or p-type silicon.

An ultrathin film of cobalt acetate ($Co(OA_c)_2$) 26 is deposited over the surface of the substrate by a spin-on method to a thickness of between about 500 and 2000 Angstroms.

An array of refractory metallic tips 15 made of platinum, tantalum, titanium, or metal nitride is heated to a temperature of between about 500 and 1200° C. and placed in contact with the thin film 26 at specific locations where the silicide features are to be formed. The heated metallic tips contacting the thin film causes localized formation of cobalt silicide 30, as shown in FIG. 7. Lines and features may be formed by maneuvering of the metallic tips.

Figure 8:

The unreacted film 26 is removed, leaving the metallic silicide features 30 on the silicon substrate, shown in FIG. 8. Platinum acetate, tantalum acetate, or palladium acetate may be used in place of the cobalt acetate in this embodiment.

Figure 9:
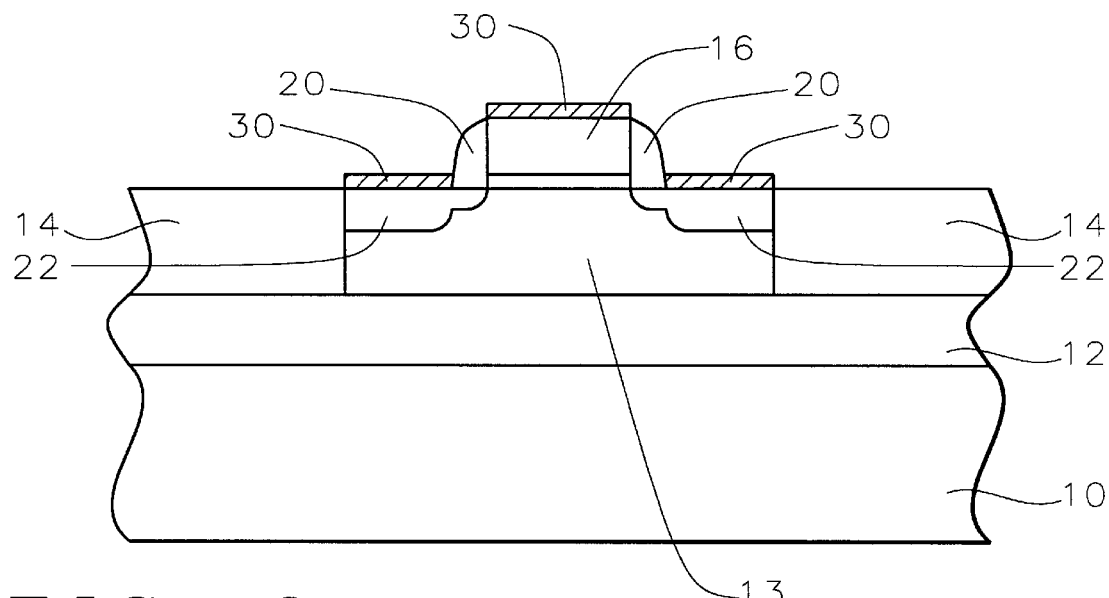
FIG. 9 schematically illustrates in cross-sectional representation an example of a completed integrated circuit device fabricated by the process of the present invention.

This formation of silicide features can be incorporated into a typical transistor process flow. For example, as shown in FIG. 9, a typical transistor fabrication process flow includes formation of shallow trench isolation 14, gate 16, sidewall spacers 20, and source/drain junctions 22. Subsequently, a thin layer of metal of metal acetate is spin-coated. The metal or metal acetate is transformed to metal silicide at specific areas according to one of the three embodiments of the invention. Suicide 30 is formed, for example, on the gate 16 and over the source/drain regions 22.

The process of the invention is especially suited for fabricating ultrathin silicide films on silicon-on-insulator (SOI) substrates, as shown in FIG. 9 where silicon 13 has been formed overlying the insulating layer 12. The main advantage for SOI applications is that no substrate heating is required which reduces any additional thermal stress induced on the silicon channel 13 overlying the silicon dioxide layer 12.

The process of the invention provides an effective method of forming ultrathin uniform silicide features. Local silicidation is performed by contacting a metallic layer with metallic tips or by thermal treatment. Experimental results obtained from palladium localized silicidation using scanning thermal microscopy tips have confirmed that resulting silicide features are uniform.

While the invention has been particularly shown and described with reference to the preferred embodiments thereof, it will be understood by those skilled in the art that various changes in form and details may be made without departing from the spirit and scope of the invention.

What is claimed is:

1. A method of fabricating silicide features in the manufacture of an integrated circuit device comprising:

depositing a metal layer over the surface of a silicon semiconductor substrate;

contacting said metal layer with an array of heated metallic tips whereby said metal layer is transformed to a metal silicide where said metallic tips contact said metal layer and wherein said metal layer not contacted by said metallic tips is unreacted; and thereafter removing said unreacted metal layer leaving said metal silicide as said silicide features in the manufacture of said integrated circuit device.

2. The method according to claim 1 wherein said metal layer comprises one of the group containing cobalt, platinum, titanium, tantalum, and nickel and has a thickness of between about 50 and 200 Angstroms.

3. The method according to claim 1 wherein said metallic tips comprise one of the group containing platinum, tantalum, and titanium.

4. The method according to claim 1 wherein said metallic tips comprise a refractory metal.

5. The method according to claim 1 wherein said metallic tips comprise a metal nitride.

6. The method according to claim 1 wherein said metallic tips are heated to a temperature of between about 500 and 1200° C.

7. The method according to claim 1 wherein said silicide features have a spatial width of less than 0.1 microns.

8. A method of fabricating silicide features in the manufacture of an integrated circuit device comprising:

spin-coating a metal acetate layer over the surface of a silicon semiconductor substrate;

contacting said metal acetate layer with an array of heated metallic tips whereby said metal acetate layer is transformed to a metal silicide where said metallic tips contact said metal acetate layer and wherein said metal acetate layer not contacted by said metallic tips is unreacted; and thereafter removing said unreacted metal acetate layer leaving said metal silicide as said silicide features in the manufacture of said integrated circuit device.

9. The method according to claim 8 wherein said metal acetate layer comprises cobalt acetate and has a thickness of between about 500 and 2000 Angstroms.

10. The method according to claim 8 wherein said metal acetate layer comprises one of the group containing cobalt acetate, nickel acetate, platinum acetate, tantalum acetate, and palladium acetate and has a thickness of between about 500 and 2000 Angstroms.

11. The method according to claim 8 wherein said metallic tips comprise one of the group containing platinum, tantalum, and titanium.

12. The method according to claim 8 wherein said metallic tips comprise a refractory metal.

13. The method according to claim 8 wherein said metallic tips comprise a metal nitride.

14. The method according to claim 8 wherein said metallic tips are heated to a temperature of between about 500 and 1200° C.

15. The method according to claim 8 wherein said silicide features have a spatial width of less than 0.1 microns.

16. The method according to claim 8 further comprising heating in a $H_2$ or $N_2$ atmosphere at high vacuum of between about $10^{-5}$ and $10^{-7}$ Torr to a temperature of between about 300 to 500° C. and less than about 900° C.

17. The method according to claim 8 further comprising heating in a $H_2$ or $N_2$ atmosphere at an ultrahigh vacuum of between about $10^{-10}$ and $10^{-11}$ Torr to a temperature of between about 300 to 500° C. and less than about 900° C.

18. A method of fabricating silicide features in the manufacture of an integrated circuit device comprising:

spin-coating a metal acetate layer over the surface of a silicon semiconductor substrate;

contacting said metal acetate layer with an array of heated metallic tips under vacuum whereby said metal acetate layer is transformed to a metal silicide where said metallic tips contact said metal acetate layer and wherein said metal acetate layer not contacted by said metallic tips is unreacted and whereby said metal acetate is not oxidized; and thereafter removing said unreacted metal acetate layer leaving said metal silicide as said silicide features in the manufacture of said integrated circuit device.

19. The method according to claim 18 wherein said metal acetate layer comprises one of the group containing cobalt acetate, platinum acetate, nickel acetate, tantalum acetate, and palladium acetate and has a thickness of between about 500 and 2000 Angstroms.

20. The method according to claim 18 wherein said vacuum comprises a $H_2$ or $N_2$ atmosphere at high vacuum of between about $10^{-5}$ and $10^{-7}$ Torr and a temperature of between about 300 to 500° C. and less than about 900° C.

21. The method according to claim 18 wherein said vacuum comprises a $H_2$ or $N_2$ atmosphere at an ultrahigh vacuum of between about $10^{-10}$ and $10^{-11}$ Torr and a temperature of between about 300 to 500° C. and less than about 900° C.

22. The method according to claim 18 wherein said metallic tips are aligned in a layout.

23. The method according to claim 18 wherein said silicide features have a spatial width of less than 0.1 microns.

* * * * *